United States Patent
Mori et al.

(10) Patent No.: US 10,549,535 B2
(45) Date of Patent: Feb. 4, 2020

(54) HEAD UNIT AND LIQUID EJECTION APPARATUS

(71) Applicant: BROTHER KOGYO KABUSHIKI KAISHA, Nagoya-shi, Aichi-ken (JP)

(72) Inventors: Shogo Mori, Nagoya (JP); Motohiro Tsuboi, Nagoya (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 0 days.

(21) Appl. No.: 15/939,437

(22) Filed: Mar. 29, 2018

(65) Prior Publication Data
US 2019/0100005 A1  Apr. 4, 2019

(30) Foreign Application Priority Data

Sep. 29, 2017  (JP) .................................. 2017-192089

(51) Int. Cl.
 *B41J 2/14* (2006.01)
 *H05K 1/02* (2006.01)

(52) U.S. Cl.
 CPC ......... *B41J 2/1433* (2013.01); *B41J 2/14072* (2013.01); *B41J 2/14201* (2013.01); *H05K 1/0272* (2013.01); *B41J 2002/14491* (2013.01); *B41J 2202/20* (2013.01)

(58) Field of Classification Search
 CPC ...... B41J 2/14; B41J 2/14201; B41J 2/14072; B41J 2/1433; B41J 2002/14491; B41J 2202/20; B41J 2202/13; B41J 2/155; B41J 2/2146; B41J 2/515; B41J 2202/21
 See application file for complete search history.

(56) References Cited

U.S. PATENT DOCUMENTS

2005/0083379 A1*  4/2005  Chikamoto .......... B41J 2/14209
                                                            347/68
2005/0133898 A1*  6/2005  Ito ....................... B41J 2/14209
                                                            257/686

(Continued)

FOREIGN PATENT DOCUMENTS

EP   2 261 034 A1   12/2010
JP   2015054439 A    3/2015

(Continued)

OTHER PUBLICATIONS

Kubota, MachineTranslationofJP-2016203394-A (Year: 2016).*
Extended European Search Report issued in related European Patent Application No. 18165178.7, dated Oct. 10, 2018.

*Primary Examiner* — Scott A Richmond
(74) *Attorney, Agent, or Firm* — Merchant & Gould P.C.

(57) ABSTRACT

A head unit includes a circuit board, a casing, and a head module including: a nozzle plate and a liquid-passage defining member stacked on each other in a stacking direction; a drive element; and an interconnect member. A distance between a first end and a second end of the nozzle plate which are spaced in a first direction is greater than a distance between a third end and a fourth end of the nozzle plate which are spaced in a second direction. A distance between a seventh end and an eighth end of the circuit board which are spaced in the stacking direction is greater than a distance between a fifth end and a sixth end of the circuit board which are spaced in the first direction.

19 Claims, 12 Drawing Sheets

(56) References Cited

U.S. PATENT DOCUMENTS

| | | | | |
|---|---|---|---|---|
| 2005/0157045 A1* | 7/2005 | Silverbrook | ......... | B41J 2/14427 |
| | | | | 347/42 |
| 2006/0214997 A1* | 9/2006 | Chikamoto | .......... | B41J 2/14209 |
| | | | | 347/71 |
| 2011/0018922 A1 | 1/2011 | Ueda | | |
| 2014/0192115 A1* | 7/2014 | Suzuki | ................ | B41J 2/14209 |
| | | | | 347/50 |
| 2015/0224764 A1 | 8/2015 | Iijima | | |
| 2015/0328883 A1* | 11/2015 | Iijima | .................. | B41J 2/14233 |
| | | | | 347/9 |
| 2017/0197431 A1 | 7/2017 | Yamada et al. | | |
| 2018/0022085 A1* | 1/2018 | Ishizaki | ................. | B41J 29/377 |
| | | | | 347/10 |

FOREIGN PATENT DOCUMENTS

| | | | | |
|---|---|---|---|---|
| JP | 2016-078239 | | 5/2016 | |
| JP | 2016-203394 | | 12/2016 | |
| JP | 2016203394 | A * | 12/2016 | |
| JP | 2017-105116 | | 6/2017 | |

* cited by examiner

FIG.1
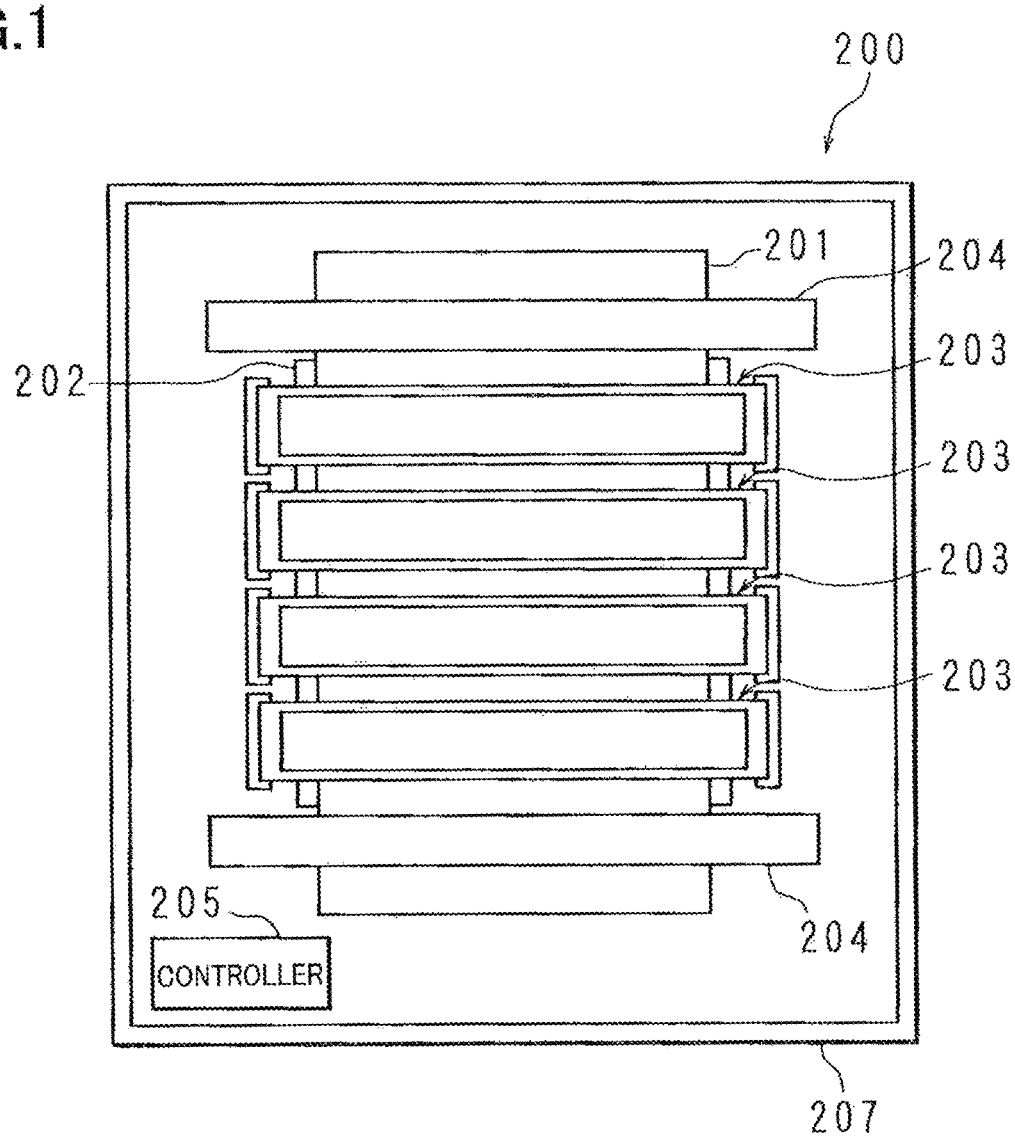
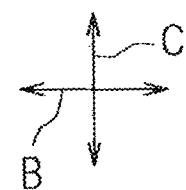

HEAD UNIT AND LIQUID EJECTION APPARATUS

CROSS REFERENCE TO RELATED APPLICATION

The present application claims priority from Japanese Patent Application No. 2017-192089, which was filed on Sep. 29, 2017, the disclosure of which is herein incorporated by reference in its entirety.

BACKGROUND

The following disclosure relates to a head unit and a liquid ejection apparatus.

There is known a head unit (a liquid ejection head) including a circuit board.

SUMMARY

In the above-described head unit, increase in size of the circuit board in the longitudinal direction of the head unit increases the dimension of the head unit in its longitudinal direction. In the case where a line head is constituted by a plurality of the head units arranged in the longitudinal direction, the head units including the respective circuit boards of a larger size cannot be arranged with high density, unfortunately.

Accordingly, an aspect of the disclosure relates to a head unit and a liquid ejection apparatus capable of preventing interference between head units each as the head unit.

In one aspect of the disclosure, a head unit to be installed in a liquid ejection apparatus includes: a head module including (i) a nozzle plate including an ejection surface defining an ejection opening, (ii) a liquid-passage defining member including a liquid passage communicating with the ejection opening, the liquid-passage defining member and the nozzle plate being stacked on each other in a stacking direction orthogonal to the ejection surface, (iii) a drive element configured to eject liquid from the ejection opening, and (iv) an interconnect member connected to the drive element; a circuit board connected to the interconnect member; and a casing connected to the head module and defining an accommodation space for accommodating the circuit board. The nozzle plate includes: a first end and a second end spaced apart from each other in a first direction that is orthogonal to the stacking direction and that is along the ejection surface; and a third end and a fourth end spaced apart from each other in a second direction that is orthogonal to each of the stacking direction and the first direction and that is along the ejection surface. A distance between the first end and the second end of the nozzle plate is greater than a distance between the third end and the fourth end of the nozzle plate. The circuit board is disposed in the accommodation space such that a main surface of the circuit board extends along the stacking direction and the first direction. The circuit board includes: a fifth end and a sixth end spaced apart from each other in the first direction; and a seventh end and an eighth end spaced apart from each other in the stacking direction. A distance between the seventh end and the eighth end of the circuit board is greater than a distance between the fifth end and the sixth end of the circuit board.

In another aspect of the disclosure, a liquid ejection apparatus installed with a plurality of head units each including: a head module including (i) a nozzle plate including an ejection surface defining an ejection opening, (ii) a liquid-passage defining member including a liquid passage communicating with the ejection opening, the liquid-passage defining member and the nozzle plate being stacked on each other in a stacking direction orthogonal to the ejection surface, (iii) a drive element configured to eject liquid from the ejection opening, and (iv) an interconnect member connected to the drive element; a circuit board connected to the interconnect member; and a casing connected to the head module and defining an accommodation space for accommodating the circuit board. The nozzle plate includes: a first end and a second end spaced apart from each other in a first direction that is orthogonal to the stacking direction and that is along the ejection surface; and a third end and a fourth end spaced apart from each other in a second direction that is orthogonal to each of the stacking direction and the first direction and that is along the ejection surface. A distance between the first end and the second end of the nozzle plate is greater than a distance between the third end and the fourth end of the nozzle plate. The circuit board is disposed in the accommodation space such that a main surface of the circuit board extends along the stacking direction and the first direction. The circuit board includes: a fifth end and a sixth end spaced apart from each other in the first direction; and a seventh end and an eighth end spaced apart from each other in the stacking direction. A distance between the seventh end and the eighth end of the circuit board is greater than a distance between the fifth end and the sixth end of the circuit board.

Effects

According to the present disclosure, it is possible to prevent interference between head units.

BRIEF DESCRIPTION OF THE DRAWINGS

The objects, features, advantages, and technical and industrial significance of the present disclosure will be better understood by reading the following detailed description of the embodiment, when considered in connection with the accompanying drawings, in which:

FIG. 1 is a plan view of main components of an ink-jet printer according to the present embodiment;

DETAILED DESCRIPTION OF THE EMBODIMENT

Figure 2:
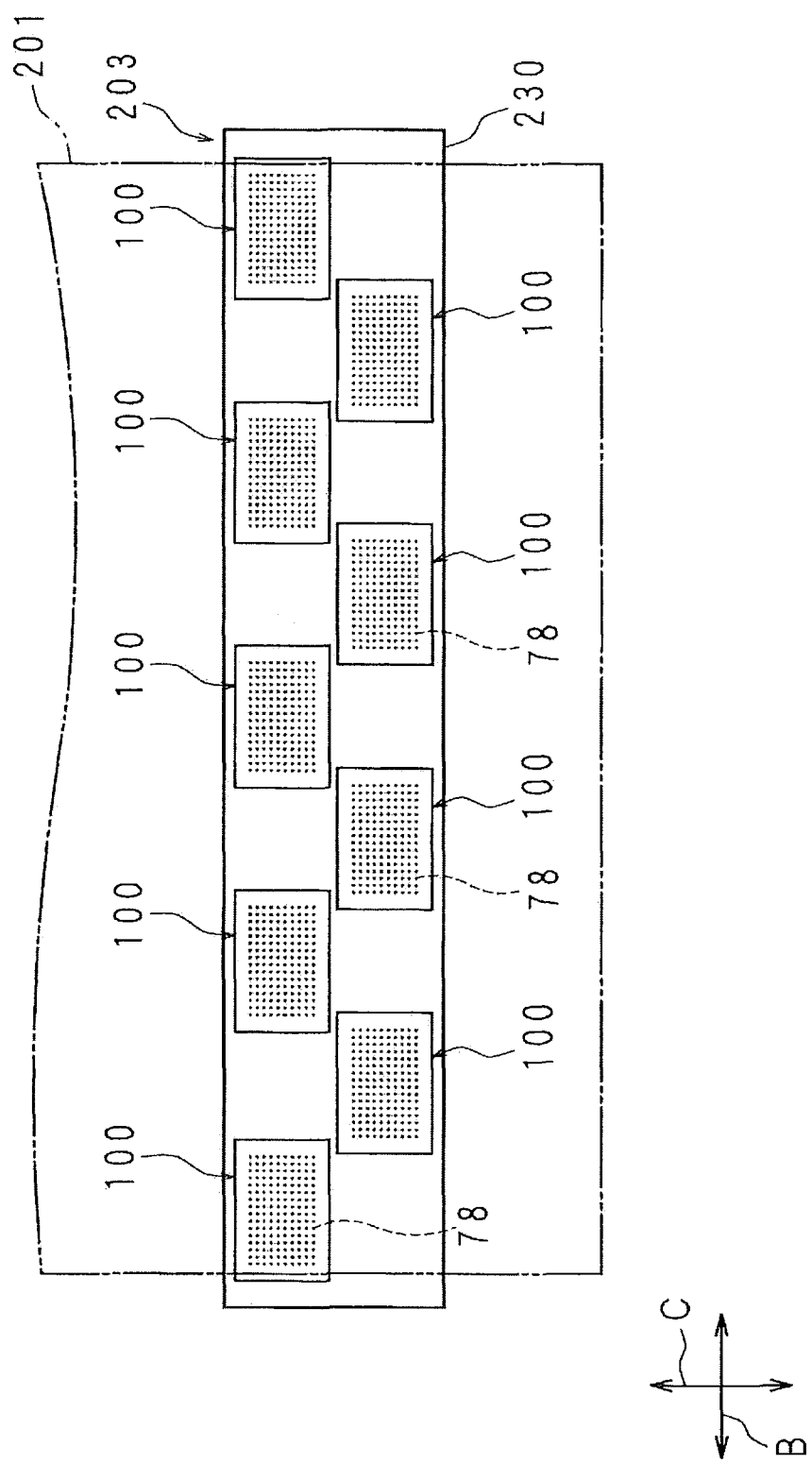
FIG. 2 is a plan view of main components of an ink-jet head in the present embodiment when the ink-jet head is viewed from a nozzle-surface side.

Hereinafter, there will be described one embodiment by reference to the drawings. It is to be understood that the following embodiment is described only by way of example, and the disclosure may be otherwise embodied with various modifications without departing from the scope and spirit of the disclosure. FIG. 1 illustrates an ink-jet printer 200 according to the present embodiment. In the following description, directions B, C in FIG. 1 are examples of a first direction and a second direction, respectively. The ink-jet printer 200 is one example of a liquid ejection apparatus. The ink-jet printer 200 includes: a housing 207; a platen 202 disposed in the housing 207; four ink-jet heads 203; two rollers 204; and a controller 205. It is noted that the numbers of the ink-jet heads 203 and the rollers 204 are not limited to those in FIG. 1.

The platen 202 supports recording sheets 201 to be used in the ink-jet printer 200. The rollers 204 are disposed on opposite ends of the platen 202 in the direction C. Rotation of the rollers 204 conveys each of the recording sheets 201 in the direction C.

The ink-jet heads 203 are arranged so as to be opposed to the platen 202 such that the outer shape of each of the ink-jet heads 203 is a rectangular shape in plan view. Specifically, the ink-jet heads 203 are arranged in a state in which the short sides of the rectangular shape of the ink-jet head 203 extend in a conveying direction in which the recording sheet 201 is conveyed (i.e., the direction C), and the long sides of the rectangular shape of the ink-jet head 203 extend in a direction (i.e., the direction B) orthogonal to the conveying direction. The ink-jet heads 203 are arranged between the two rollers 204 such that one of long-side surfaces of each of the ink-jet heads 203 is opposed to one of long-side surfaces of a corresponding adjacent one of the ink-jet heads 203 at an appropriate distance.

The four ink-jet heads 203 respectively correspond to cyan, magenta, yellow, and black, for example.

The controller 205 includes a field-programmable gate array (FPGA), a read only memory (ROM), a random access memory (RAM), and an electrically erasable programmable read-only memory (EEPROM), which are not illustrated. The controller 205 is capable of performing mutual communication with external devices such as personal computers. When instructed from the external device or an operation device, not illustrated, of the ink-jet printer 200, the controller 205 controls operations of the ink-jet heads 203 and the rollers 204 according to programs stored in the ROM. It is noted that a central processing unit (CPU) or a microprocessor unit (MPU) may be used instead of the FPGA.

The controller 205 operates a motor, not illustrated, to control operations of the rollers 204 to convey the recording sheet 201. During conveyance of the recording sheet 201, the controller 205 controls the ink-jet heads 203 to eject ink onto the recording sheet 201.

As illustrated in FIG. 2, each of the ink-jet heads 203 includes: a support plate 230 having a rectangular shape in plan view; and a plurality of head units 100 held by the support plate 230 by being respectively fitted in openings formed in the support plate 230. The support plate 230 holds a portion of each of the head units 100 which is near its nozzle surface. While each of the ink-jet heads 203 includes the nine head units 100 in the example in FIG. 2, the number of the head units 100 is not limited to nine.

The head units 100 are arranged in two rows that are arranged in the direction C. Four of the head units 100 are arranged in the direction B in one of the rows, and the other five head units 100 are arranged in the direction B in the other of the rows. That is, the plurality of head units 100 are arranged along the direction B (as one example of the first direction). It is noted that, since the head units 100 have the same configuration, the following description will be provided for one of the head units 100 for simplicity unless otherwise required, and likewise the following description will be provided for one of the ink-jet heads 203 for simplicity unless otherwise required. The nozzle surface of the head unit 100 has ejection openings 78 of a multiplicity of nozzles. It is noted that the ejection openings 78 of the nozzles are schematically illustrated for easy understanding, and the arrangement and the number of the ejection openings 78 in the drawings are different from those of the ejection openings 78 in reality.

The ink-jet head 203 includes a holder, not illustrated, opposed to the support plate 230. The holder holds a portion of the head unit 100 which is far from the nozzle surface. The head unit 100 is mountable on and removable from the ink-jet head 203. That is, the head unit 100 is installable in and removable from the ink-jet printer 200.

The ink-jet head 203 is provided with a reservoir, not illustrated, for storing the ink. The reservoir is connected to an ink cartridge, not illustrated. The reservoir receives the ink from the ink cartridge and stores a particular amount of the ink. The reservoir supplies the ink to the head unit 100 via a plurality of communication liquid passages.

Figure 3:
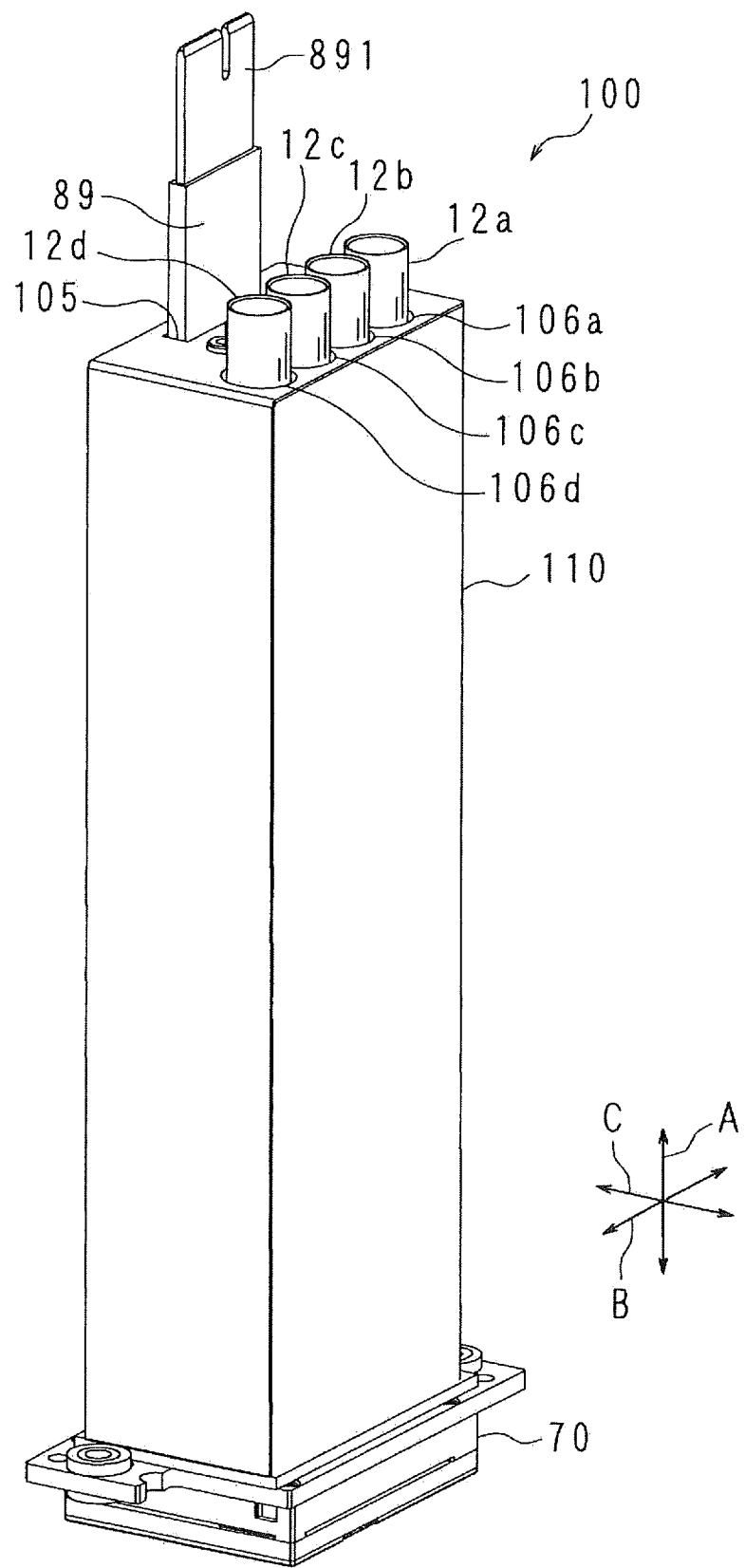
FIG. 3 is an external perspective view of a head unit according to the present embodiment.

As illustrated in FIG. 3, the head unit 100 is mounted on a body of the ink-jet head 203 and includes: a head module 70 having a nozzle surface (as one example of an ejection surface) having the openings (the ejection openings) 78 of the respective nozzles; and a casing 110 connected to the head module 70.

One of opposite ends of the head module 70, which one is farther from the casing 110 than the other, in a stacking direction (indicated by arrow A in FIG. 3) orthogonal to the nozzle surface, has: insertion holes 106a, 106b, 106c, 106d in which cylindrical connecting portions 12a, 12b, 12c, 12d are respectively inserted; and an insertion hole 105 in which a connecting portion 89 of an elongated circuit board 80, which will be described below, is inserted. It is noted that liquid-passage tubes, which will be described below, are respectively connected to the connecting portions 12a, 12b, 12c, 12d. The casing 110 defines an accommodation space for accommodating the circuit board 80.

The head unit 100 includes an elongated holding plate 90. A top plate 10 is fastened to one of opposite ends of the holding plate 90. A bottom plate 60 is fastened to the other of the opposite ends of the holding plate 90. The bottom plate 60 is fastened to the head module 70. That is, the holding plate 90 is fastened to the head module 70. The holding plate 90 has a main surface 901 parallel with a direction A and the direction B. The main surface 901 is elongated in the direction A. The holding plate 90 has a bent portion 902 bent near one end of the main surface 901 in the up and down direction or the stacking direction in which a nozzle plate 780 and a liquid-passage defining member 720 are stacked on each other. The holding plate 90 has an extending portion 903 extending from the bent portion 902 in the direction B that coincides with the widthwise direction of the nozzle plate 780. The holding plate 90 is screwed to the head module 70 at the extending portion 903.

The circuit board 80 is disposed in an accommodation space such that its main surface 801 extends along the directions A, B. The circuit board 80 is connected to a flexible printed circuit (FPC) 760.

The top plate 10 is provided with the four connecting portions 12a, 12b, 12c, 12d connectable to the ink-jet printer 200 and each having a communication opening, not illustrated, communicable with a corresponding one of the communication liquid passages, not illustrated, of the ink-jet printer 200.

The head unit 100 includes: a liquid-passage tube 11a fluidically connected to the communication opening of the connecting portion 12a and contained in the casing 110; branch-liquid-passage tubes 13b, 13c fluidically connected to the liquid-passage tube 11a and contained in the casing 110; and a tube joint 46 contained in the casing 110 and connecting the liquid-passage tube 11a to the branch-liquid-passage tubes 13b, 13c such that the branch-liquid-passage tubes 13b, 13c branch off from the liquid-passage tube 11a. Each of the liquid-passage tube 11a and the branch-liquid-passage tubes 13b, 13c is a resin tube for supplying the ink to the head module 70, for example.

The head unit 100 includes: a liquid-passage tube 11b fluidically connected to the communication opening of the connecting portion 12b and contained in the casing 110; branch-liquid-passage tubes 13a, 13d fluidically connected to the liquid-passage tube 11b and contained in the casing 110; and a tube joint 43 contained in the casing 110 and connecting the liquid-passage tube 11b to the branch-liquid-passage tubes 13a, 13d such that the branch-liquid-passage tubes 13a, 13d branch off from the liquid-passage tube 11b. Each of the liquid-passage tube 11b and the branch-liquid-passage tubes 13a, 13d is a resin tube for transferring the ink from the head module 70 back to the reservoir, not illustrated, for example.

The tube joint 46 includes three plugs 461, 462, 463 and a receptacle 460. The liquid-passage tube 11a is connected to the plug 461. The branch-liquid-passage tube 13b is connected to the plug 462. The branch-liquid-passage tube 13c is connected to the plug 463. The receptacle 460 has branch liquid passages therein and is connected to the plugs 461, 462, 463.

The tube joint 43 includes three plugs 431, 432, 433 and a receptacle 430. The liquid-passage tube 11b is connected to the plug 431. The branch-liquid-passage tube 13d is connected to the plug 432. The branch-liquid-passage tube 13a is connected to the plug 433. The receptacle 430 has branch liquid passages therein and is connected to the plugs 431, 432, 433. It is noted that each of the tube joints 43, 46 is constituted by the plugs and the receptacle and is easy to attach and detach with a one-touch operation, but the present disclosure is not limited to this configuration. For example, each of the tube joints 43, 46 may be constituted by a single component such as a pipe having a liquid passage that is branched in a Y-shape.

The head unit 100 includes: a cooling tube 11c fluidically connected to the communication opening of the connecting portion 12c and contained in the casing 110; and a cooling tube 11d fluidically connected to the communication opening of the connecting portion 12d and contained in the casing 110. Each of the cooling tubes 11c, 11d is a resin tube. It is noted that a tube joint may be provided at an appropriate middle portion of each of the cooling tubes 11c, 11d.

Bottom connectors, not illustrated, are provided at the bottom plate 60 so as to respectively correspond to the branch-liquid-passage tubes 13a, 13b, 13c, 13d and the cooling tubes 11c, 11d. Each of the bottom connectors is a receptacle secured to the bottom plate 60. The branch-liquid-passage tubes 13a, 13b, 13c, 13d and the cooling tubes 11c, 11d are secured to one ends of the respective bottom connectors. The bottom connectors respectively have through liquid passages respectively fluidically connected to liquid-passage openings 71, 72, 73, 74, 75, 76 formed in the head module 70. The other ends of the respective bottom connectors are respectively connected to recessed portions 711, 721, 731, 741, 751, 761 formed in the head module 70.

Figure 5:
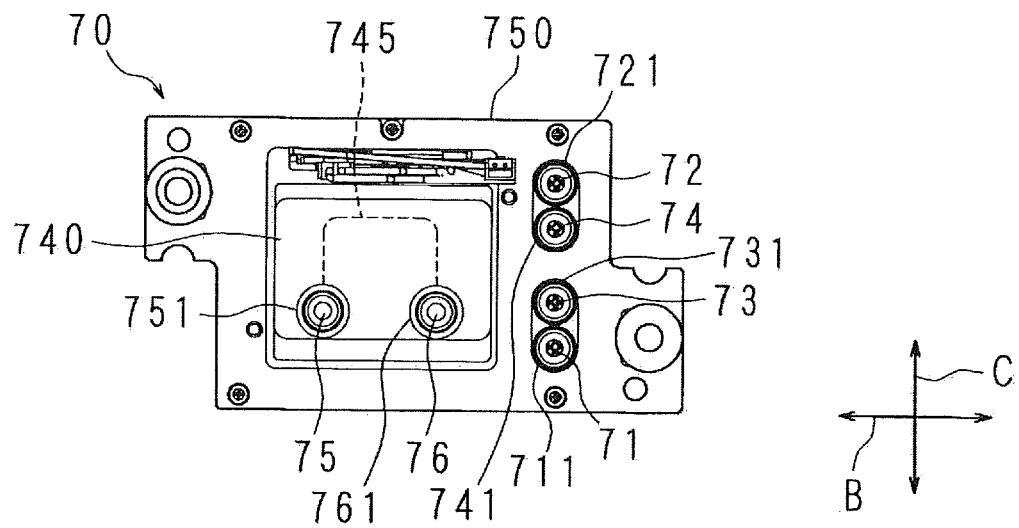
FIG. 5 is a plan view of a head module in the present embodiment when the head module is viewed from a case side.

As illustrated in FIG. 5, the liquid-passage opening 71 is an opening of a liquid passage which is formed in a bottom surface of the recessed portion 711 formed in the head module 70. The liquid-passage opening 72 is an opening of a liquid passage which is formed in a bottom surface of the recessed portion 721 formed in the head module 70. The liquid-passage opening 73 is an opening of a liquid passage which is formed in a bottom surface of the recessed portion 731 formed in the head module 70. The liquid-passage opening 74 is an opening of a liquid passage which is formed in a bottom surface of the recessed portion 741 formed in the head module 70. The liquid-passage opening 75 is an opening of a liquid passage which is formed in a bottom surface of the recessed portion 751 formed in the head module 70. The liquid-passage opening 76 is an opening of a liquid passage which is formed in a bottom surface of the recessed portion 761 formed in the head module 70. Each of the recessed portions 711, 721, 731, 741, 751, 761 of the head module 70 functions as a receptacle in which a corresponding one of the bottom connectors is fitted.

Figure 6:
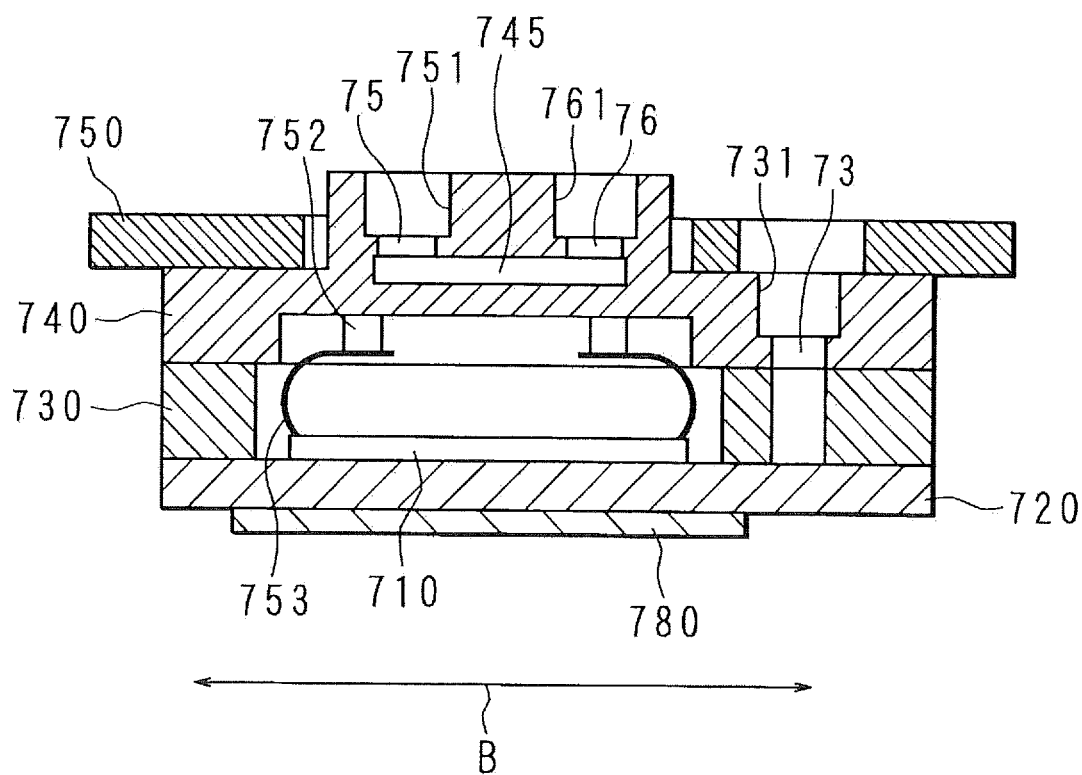
FIG. 6 is a cross-sectional view of a main portion of the head module in the present embodiment.

As illustrated in FIG. 6, the head module 70 includes the nozzle plate 780, the liquid-passage defining member 720, a frame 730, a cooling-liquid-passage defining member 740, and a fastening frame 750 stacked on one another in this order. Each of the frame 730, the cooling-liquid-passage defining member 740, and the fastening frame 750 has a liquid passage for introducing the ink to the liquid-passage defining member 720 and for returning the ink from the liquid-passage defining member 720 back to the reservoir, not illustrated. FIG. 6 illustrates the recessed portion 731 and the liquid-passage opening 73 for easy understanding.

The cooling-liquid-passage defining member 740 has: the recessed portions 751, 761 and the liquid-passage openings 75, 76 for circulation of cooling liquid; and a cooling liquid passage 745 establishing communication between the liquid-passage opening 75 and the liquid-passage opening 76.

A driver IC 752 is fixed to the cooling-liquid-passage defining member 740. An actuator 710 (as one example of a drive element) is fixed to an upper surface of the liquid-passage defining member 720. A COF (Chip On Film) 753 connecting the actuator 710 and the driver IC 752 to each other is disposed in a spaced formed in the frame 730.

Figure 7:
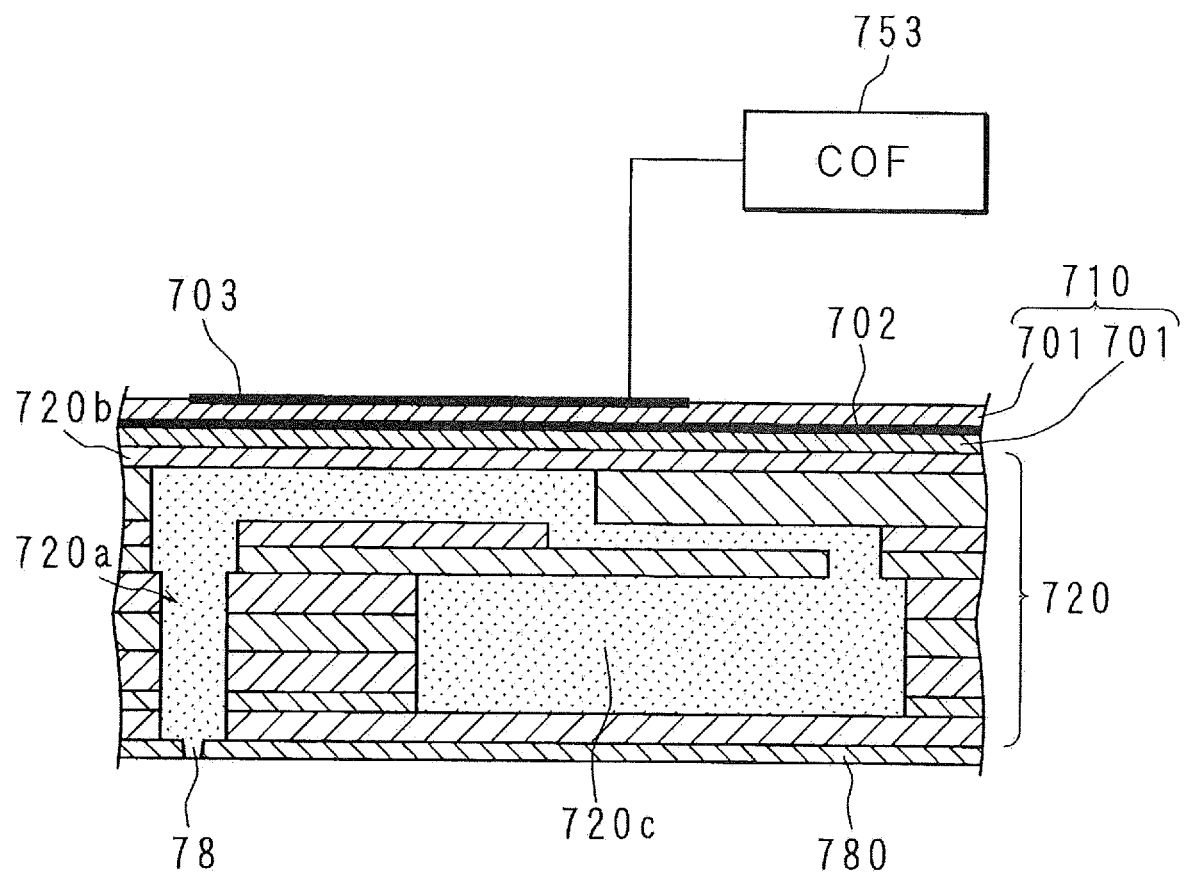
FIG. 7 is a cross-sectional view of a main portion of a liquid-passage defining member of the head module in the present embodiment.

As illustrated in FIG. 7, a lower surface of the nozzle plate 780 serves as the nozzle surface. The nozzle plate 780 has the ejection openings 78 of the respective nozzles. The nozzle plate 780 is formed of stainless steel, for example, but the present disclosure is not limited to this configuration. For example, the nozzle plate 780 may be formed of silicon, glass, ceramic, or a resin material. It is noted that the nozzle plate 780 partly constitutes the liquid-passage defining member 720.

The liquid-passage defining member 720 includes a plurality of metal plates stacked on one another in the up and down direction. The liquid-passage defining member 720 is formed of stainless steel, for example, but the present disclosure is not limited to this configuration. For example, the liquid-passage defining member 720 may be formed of silicon, glass, ceramic, or a resin material. The liquid-passage defining member 720 includes a vibration plate 720b elongated in the right and left direction and opposed to the nozzle plate 780. Pressure chambers 720a are formed just above the respective ejection openings 78 of the nozzles. The pressure chambers 720a communicate with a common liquid passage 720c. The vibration plate 720b is provided over the pressure chambers 720a so as to close openings of upper portions of the respective pressure chambers 720a.

The actuator 710 is disposed over the vibration plate 720b. The actuator 710 includes two piezoelectric layers 701 and a common electrode 702 sandwiched between the piezoelectric layers 701. The common electrode 702 is kept at ground potential. The actuator 710 includes a plurality of individual electrodes 703 arranged in the right and left direction. The individual electrodes 703 are provided on the upper piezoelectric layer 701 so as to be located just above the respective pressure chambers 720a.

The COF 753 having flexibility is shaped like a sheet and placed on an upper surface of the actuator 710. Control signals output from the controller 205 are input to the driver IC 752 via the COF 753 and the FPC 760, and the driver IC 752 outputs drive signals to the actuator 710 based on the control signals. The COF 753 and FPC 760 interconnect the circuit board 80 and actuator 710. The COF 753 and the FPC 760 are one example of a interconnect member.

When the drive signals are input to the actuator 710, the ink is ejected from the ejection openings 78 of the nozzles.

Figure 8:
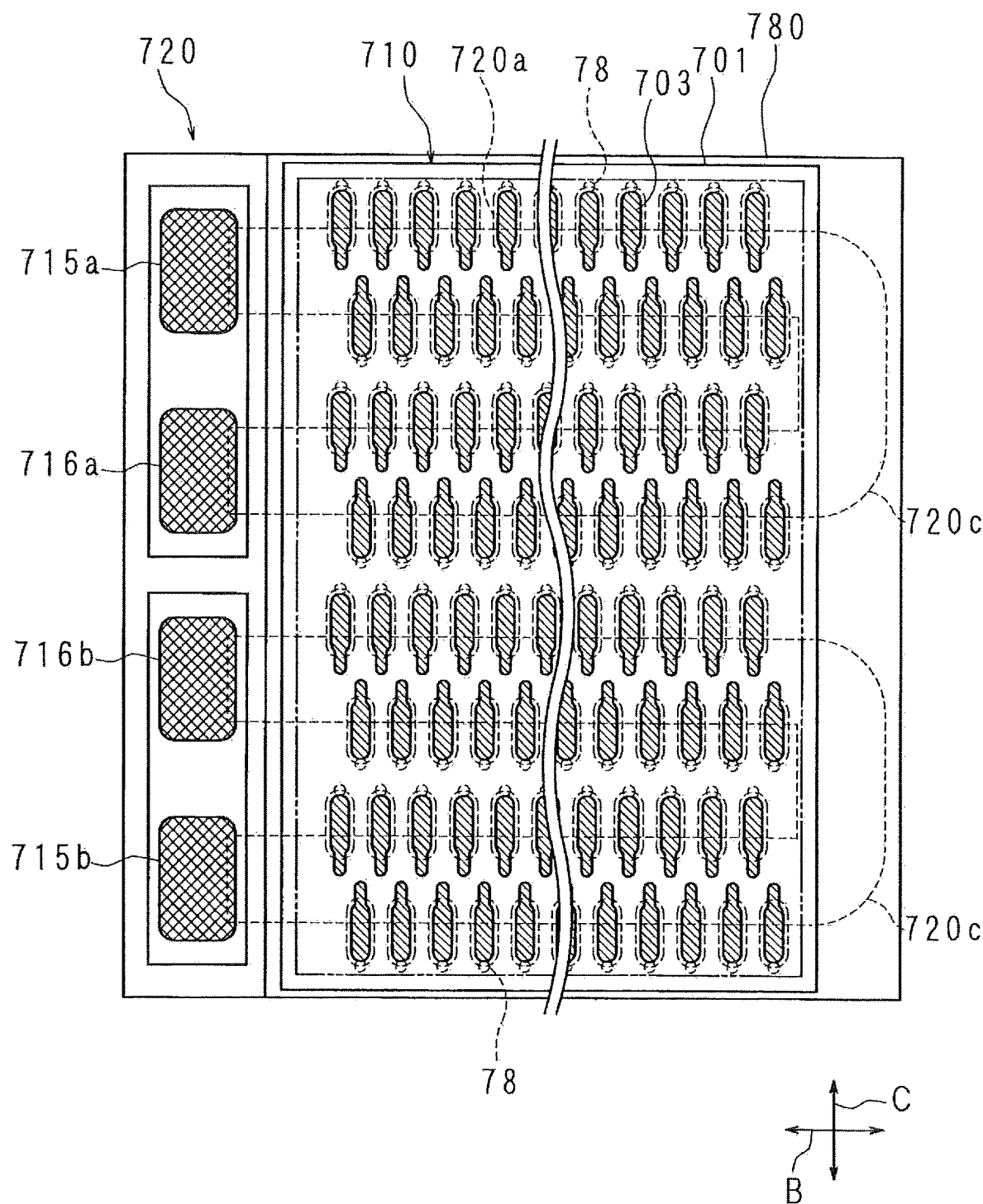
FIG. 8 is a schematic plan view of the liquid-passage defining member of the head module in the present embodiment.

As illustrated in FIG. 8, the liquid-passage defining member 720 has two supply openings 715a, 715b to which liquid (the ink) is to be supplied. The supply opening 715a communicates with the liquid-passage opening 72, and the supply opening 715b communicates with the liquid-passage opening 71. The two supply openings 715a, 715b are arranged in the direction C at a right edge portion of the liquid-passage defining member 720. Two output openings 716a, 716b for discharge of the liquid are arranged in the direction C at the right edge portion of the liquid-passage defining member 720. The output opening 716a communicates with the liquid-passage opening 74, and the output opening 716b communicates with the liquid-passage opening 73.

The supply opening 715a and the output opening 716a are connected to each other by the common liquid passage 720c having a U-shape in plan view. The supply opening 715b and the output opening 716b are connected to each other by the common liquid passage 720c having the U-shape in plan view. The common liquid passage 720c is formed in the liquid-passage defining member 720 and communicates with the pressure chambers 720a.

The ink (the liquid) supplied to the supply opening 715a and the supply opening 715b via the liquid-passage opening 72 and the liquid-passage opening 71 is transferred to the pressure chambers 720a through a common passage 717.

It is noted that, while the liquid-passage defining member 720 has the common liquid passage 720c having the U-shape in plan view in the example in FIG. 8, the present disclosure is not limited to this configuration. For example, the liquid-passage defining member 720 may be constructed so as to have: two supply openings formed instead of the output openings 716a, 716b; and a liquid passage having an I-shape in plan view and extending from the four supply openings such that the liquid (the ink) is not circulated.

Heat is generated by components including: the piezoelectric layers 701 for ejecting the liquid from the ejection openings 78; and the driver IC 752 connected to the piezoelectric layers 701. This heat raises temperatures of components including the liquid-passage defining member 720 and the actuator 710. However, circulation of the cooling water in the cooling-liquid-passage defining member 740 cools the driver IC 752, the liquid-passage defining member 720, the actuator 710, and so on. The cooling water is circulated by a pump, not illustrated, provided in the ink-jet printer 200. For example, the cooling liquid is supplied from the liquid-passage opening 75 to the cooling-liquid-passage defining member 740 and circulated from the liquid-passage opening 76 toward the pump.

Figure 9:
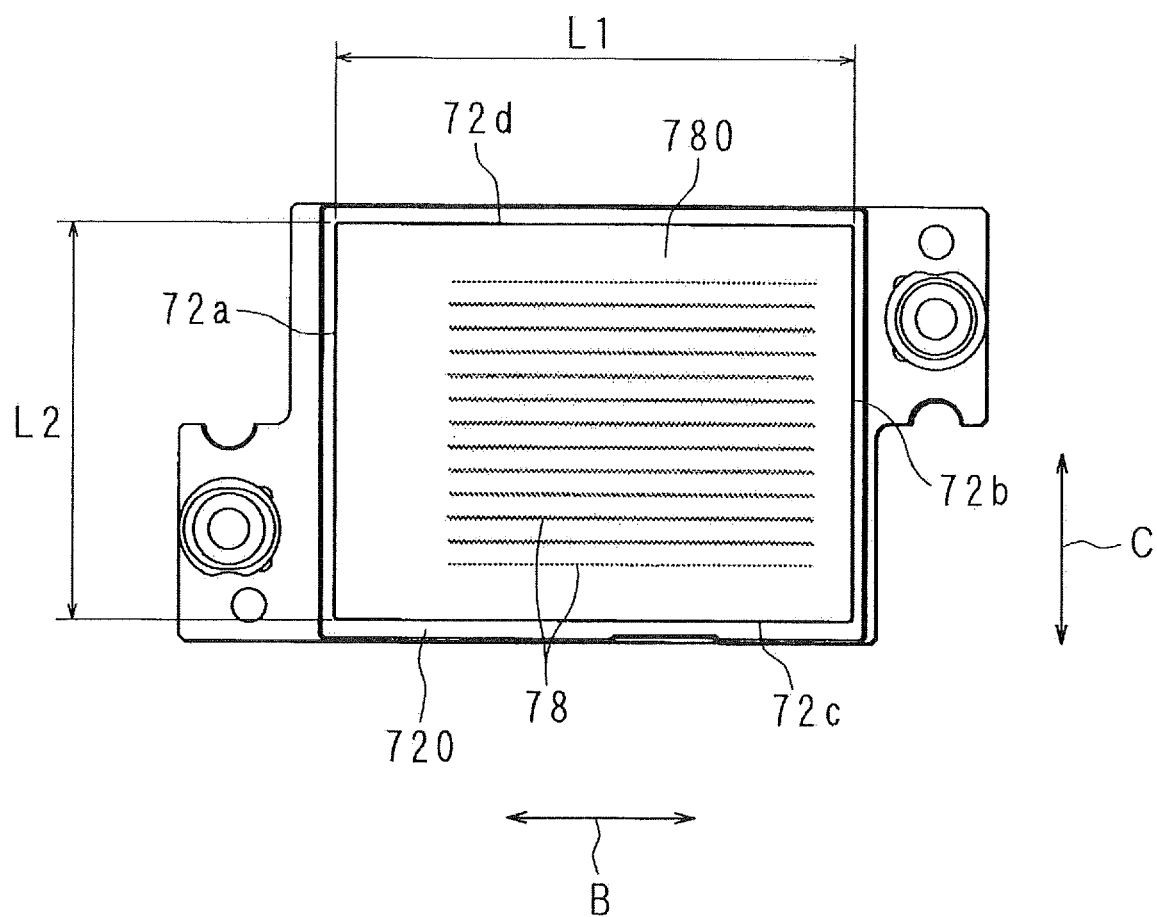
FIG. 9 is a bottom view of the head module in the present embodiment when the head module is viewed from the nozzle-surface side.

As illustrated in FIG. 9, the nozzle plate 780 has an end 72a (as one example of a first end) and an end 72b (as one example of a second end) spaced apart from each other in the direction B (as one example of the first direction) that is orthogonal to the stacking direction (i.e., the direction A illustrated in FIG. 4) and along the nozzle surface. The nozzle plate 780 includes an end 72c (as one example of a third end) and an end 72d (as one example of a fourth end) spaced apart from each other in the direction C (as one example of the second direction) that is orthogonal to each of the stacking direction and the direction B and along the nozzle surface.

The distance L1 between the end 72a and the end 72b of the nozzle plate 780 is greater than the distance L2 between the end 72c and the end 72d of the nozzle plate 780 (L1>L2).

Figure 10:
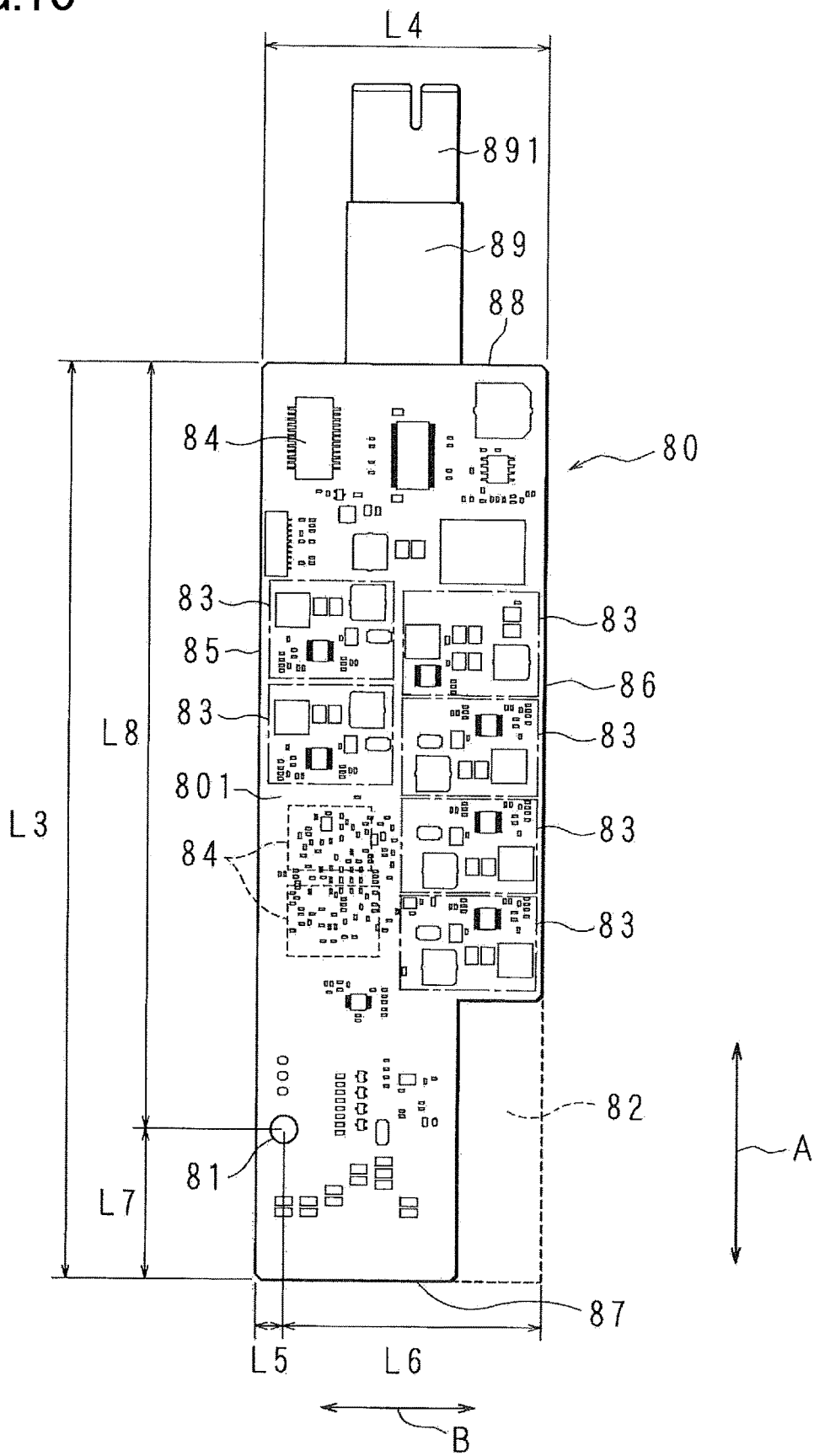
FIG. 10 is a plan view of a main portion of a circuit board in the present embodiment when the circuit board is viewed from a main-surface side.

As illustrated in FIG. 10, the circuit board 80 has an end 85 (as one example of a fifth end) and an end 86 (as one example of a sixth end) spaced apart from each other in the direction B (as one example of the first direction). The circuit board 80 has an end 87 (as one example of a seventh end) and an end 88 (as one example of an eighth end) spaced apart from each other in the direction A (i.e., the stacking direction).

Figure 4:
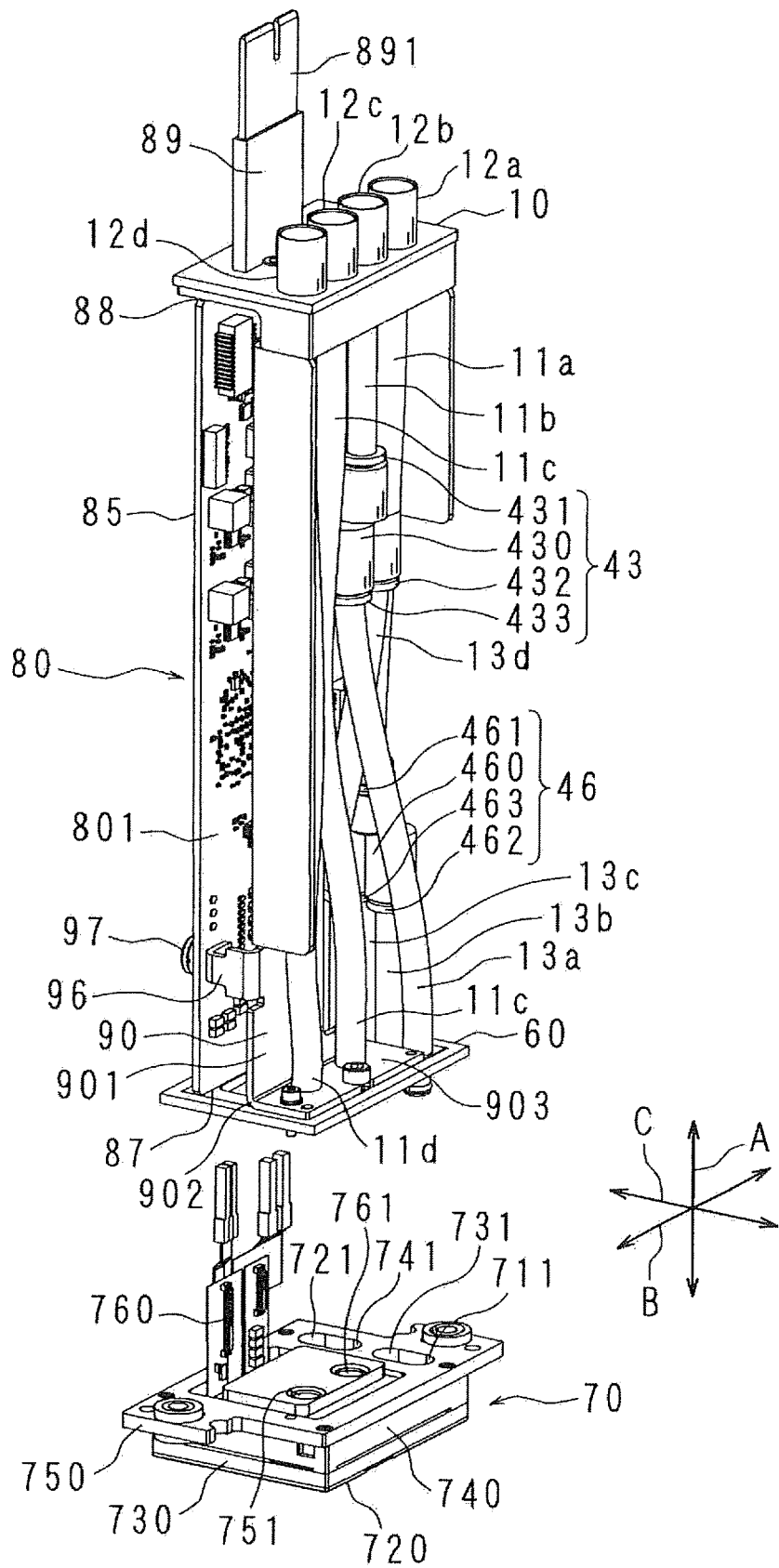
FIG. 4 is an exploded perspective view of main components of the head unit in the present embodiment in the case where a casing is removed.

As illustrated in FIG. 4, the circuit board 80 is disposed such that the end 87 is nearer to the head module 70 than the end 88, and the end 88 is nearer to the top plate 10 than the end 87.

The distance L3 between the end 87 and the end 88 of the circuit board 80 is greater than the distance L4 between the end 85 and the end 86 of the circuit board 80 (L3>L4).

With this configuration, the end 87 of the circuit board 80 can be disposed between the end 72a and the end 72b spaced apart from each other at the distance greater than the distance between the end 72c and the end 72d. Since the distance L3 between the end 87 and the end 88 of the circuit board 80 is greater than the distance L4 between the end 85 and the end 86 of the circuit board 80, increase in the distance L3 can increase the size of the circuit board 80 without increase in the distance L4. Thus, the head unit 100 does not increase in size in the longitudinal direction of the nozzle plate 780. Accordingly, in the case where the plurality of the head units 100 are arranged in the longitudinal direction of the nozzle plate 780, the head units 100 can be arranged with high density.

The circuit board 80 has a cutout portion 82 at a corner portion at which the end 87 and the end 86 intersect each other. Providing the cutout portion 82 can form a space for arrangement of components including the liquid-passage tubes 11a, 11b and the branch-liquid-passage tubes 13a, 13b, 13c, 13d in the casing 110 without interfering with the circuit board 80. It is noted that the cutout portion 82 is not essential and may be omitted.

The circuit board 80 has the connecting portion 89 protruding from the end 88 in the direction A. A circuit-board terminal 891 is formed at an end of the connecting portion 89. The circuit-board terminal 891 is connectable to a terminal of a connector 240 provided on the body of the ink-jet printer 200. The circuit-board terminal 891 is formed near the end 88.

A plurality of power supply circuits 83 are mounted on the circuit board 80 so as to be arranged in the direction A. It is noted that the arrangement of the power supply circuits 83 in FIG. 10 is one example, and the arrangement of the power supply circuits 83 is not limited to that in FIG. 10. With this configuration, the plurality of the power supply circuits 83 can be mounted without increase in the distance L4 between the end 85 and the end 86 of the circuit board 80. Thus, the head unit 100 does not increase in size in the longitudinal direction of the nozzle plate 780. Accordingly, in the case where the plurality of the head units 100 are arranged in the longitudinal direction of the nozzle plate 780, the head units 100 can be arranged with high density.

A plurality of integrated circuits (ICs) 84 are mounted on the circuit board 80 so as to be arranged in the direction A. In the example in FIG. 10, the ICs 84 are mounted also on a back surface of the circuit board 80. It is noted that the arrangement of the ICs 84 in FIG. 10 is one example, and the arrangement of the ICs 84 is not limited to that in FIG. 10. With this configuration, the plurality of the ICs 84 can be mounted without increase in the distance L4 between the end 85 and the end 86 of the circuit board 80. Thus, the head unit 100 does not increase in size in the longitudinal direction of the nozzle plate 780. Accordingly, in the case where the plurality of the head units 100 are arranged in the longitudinal direction of the nozzle plate 780, the head units 100 can be arranged with high density.

As illustrated in FIG. 4, the holding plate 90 has a holding portion 96 bent toward the circuit board 80 from one of edge portions of the holding plate 90 in the direction A. The holding plate 90 holds the circuit board 80 with a screw 97 fastened to the holding portion 96, for example. More specifically, as illustrated in FIG. 11, a screw hole is formed in a screw fastening portion 96a bent in the direction B from an end of the holding portion 96, and the screw 97 is engaged with this screw hole to fasten the circuit board 80 to the holding plate 90.

Figure 11:
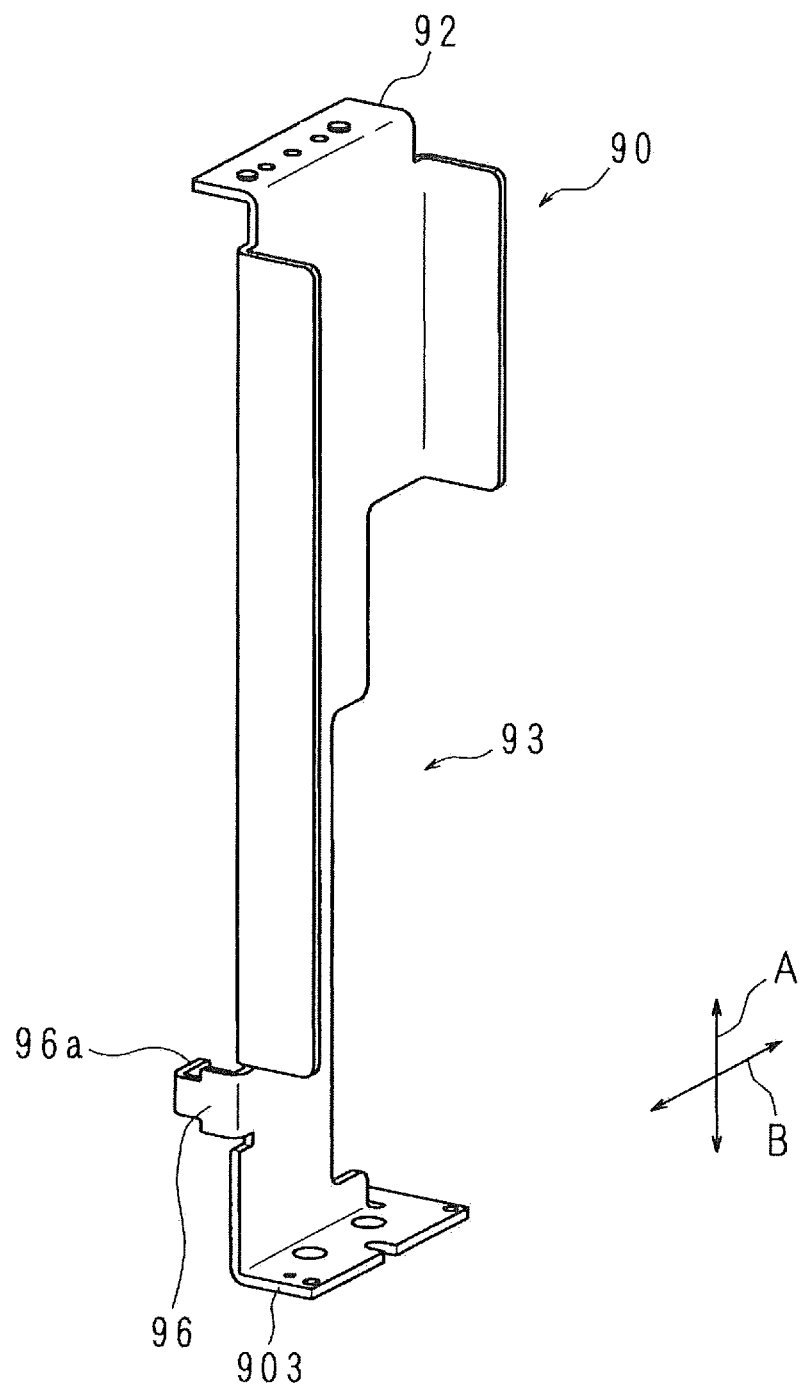
FIG. 11 is an external perspective view of a holding plate in the present embodiment.

As illustrated in FIGS. 4 and 11, the holding plate 90 is disposed between the circuit board 80 and components including the liquid-passage tubes 11a, 11b, the branch-liquid-passage tubes 13a, 13b, 13c, 13d, and the cooling tubes 11c, 11d. This configuration prevents the ink or water from adhering to the circuit board 80 or the components mounted on the circuit board 80, even if the ink or water has leaked from the connector or the joint to which one of the liquid-passage tubes 11a, 11b, the branch-liquid-passage tubes 13a, 13b, 13c, 13d, and the cooling tubes 11c, 11d is connected, and the ink or water having leaked has flowed on a surface of the tube.

As illustrated in FIG. 11, the holding plate 90 has an elongated shape and has the extending portion 903 and an end 92 as opposite ends in the direction A. The extending portion 903 is secured to the head module 70, and the end 92 is disposed near the top plate 10. The holding plate 90 has a cutout portion 93 near the extending portion 903. The cutout portion 93 is formed by cutting out a portion of one of edge portions of the holding plate 90 in the direction B. Providing the cutout portion 93 can form a space for arrangement of components including the liquid-passage tubes 11a, 11b, the branch-liquid-passage tubes 13a, 13b, 13c, 13d, and the cooling tubes 11c, 11d in the casing 110 without interfering with the holding plate 90. It is noted that the cutout portion 93 is not essential and may be omitted.

Figure 12:
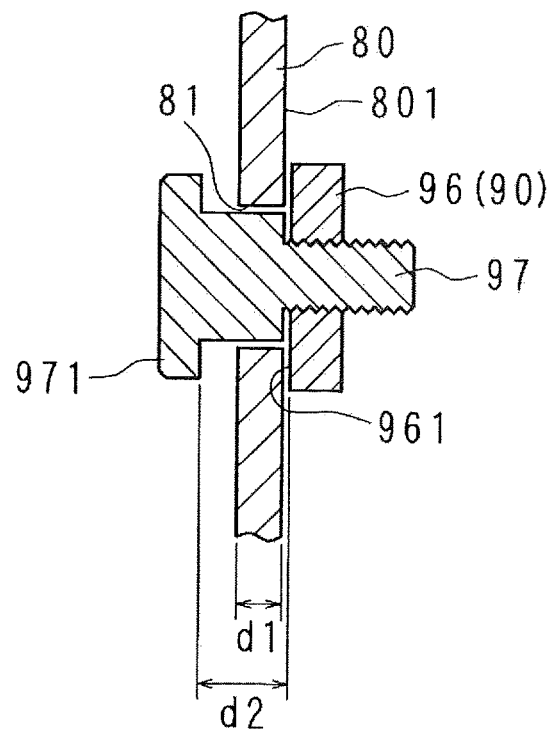
FIG. 12 is a cross-sectional view of a first example of a configuration in which the circuit board in the present embodiment is held by the holding plate.

FIG. 12 illustrates a first example of a configuration in which the circuit board 80 is held by the holding plate 90. A surface 961 of the holding portion 96 of the holding plate 90 faces the main surface 801 of the circuit board 80. The circuit board 80 has a through hole 81. The screw 97 inserted in the through hole 81 of the circuit board 80 is engaged with the through hole 81, whereby the circuit board 80 is secured to the holding portion 96 (the holding plate 90). The distance d2 between the surface 961 of the holding portion 96 and a head 971 of the screw 97 is greater than the thickness d1 of the circuit board 80 in a direction orthogonal to the main surface 801 of the circuit board 80.

With this configuration, the circuit board 80 having the end 87 secured to the head module 70 is movable, in the thickness direction of the circuit board 80 (the direction C), at its portion held by the holding plate 90 (at the through hole 81), by a distance corresponding to a difference (d2−d1) between the dimensions d1, d2 (noted that this distance may be referred to as "minute distance"). Thus, when the circuit-board terminal 891 formed on the circuit board 80 is connected to the terminal, not illustrated, of the connector 240, which will be described below, of the body, the circuit-board terminal 891 is movable by a required distance with respect to the end 87. This configuration enables positioning between the circuit-board terminal 891 and the terminal of the connector 240, facilitating connection therebetween. Also, since the circuit board 80 is movable, it is possible to make fine adjustment of the position of the nozzle plate 780 without any stress applied to the circuit-board terminal 891 of the circuit board 80.

As illustrated in FIG. 10, the distance L5 between the through hole 81 of the circuit board 80 (e.g., the center of the through hole 81) and the end 85 is less than the distance L6 between the through hole 81 and the end 86. This configuration makes it easier for the end 86 of the circuit board 80 to move than for the end 85 of the circuit board 80, enabling movement of the circuit board 80 by the minute distance.

As illustrated in FIG. 10, the distance L7 between the through hole 81 of the circuit board 80 and the end 87 of the circuit board 80 is less than the distance L8 between the through hole 81 and the end 88. This configuration facilitates movement of the end 88 of the circuit board 80, enabling movement of the circuit board 80 by the minute distance.

Figure 13:
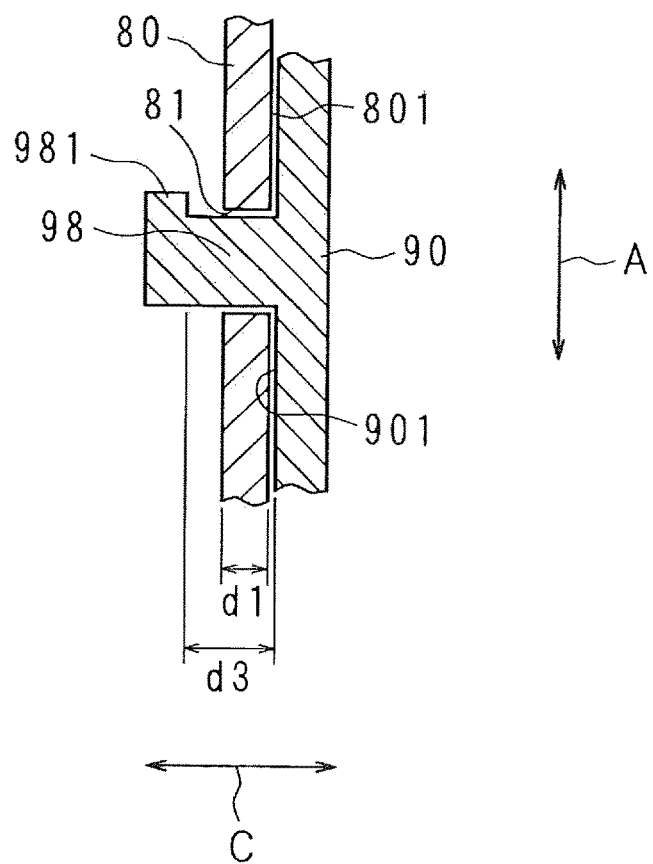
FIG. 13 is a cross-sectional view of a second example of the configuration in which the circuit board in the present embodiment is held by the holding plate.

FIG. 13 illustrates a second example of the configuration in which the circuit board 80 is held by the holding plate 90. This second example is different from the first example in that the holding plate 90 does not have the holding portion 96 and includes a protrusion 98. As illustrated in FIG. 13, the main surface 901 of the holding plate 90 faces the main surface 801 of the circuit board 80. The circuit board 80 has the through hole 81. The holding plate 90 includes: the protrusion 98 protruding from the main surface 901 in the direction C; and a protruding portion 981 protruding in the direction A from an end of the protrusion 98 in the direction C. The protrusion 98 is inserted through the through hole 81. The distance d3 between the main surface 901 of the holding plate 90 and the protruding portion 981 is greater than the thickness d1 of the circuit board 80 in the direction orthogonal to the main surface 801 (i.e., the direction C).

With this configuration, the circuit board 80 having the end 87 secured to the head module 70 is movable, in the thickness direction of the circuit board 80 (the direction C), at its portion held by the holding plate 90 (at the through hole 81), by a distance corresponding to a difference (d3–d1) between the dimensions d1, d3 (noted that this distance may be referred to as "minute distance"). Thus, when the circuit-board terminal 891 formed on the circuit board 80 is connected to the terminal, not illustrated, of the connector 240, which will be described below, of the body, the circuit-board terminal 891 is movable by a required distance with respect to the end 87. This configuration enables positioning between the circuit-board terminal 891 and the terminal of the connector 240, facilitating connection therebetween. Also, since the circuit board 80 is movable, it is possible to make fine adjustment of the position of the nozzle plate 780 without any stress applied to the circuit-board terminal 891 of the circuit board 80.

As illustrated in FIG. 3, a space is formed between an outer circumferential surface of the connecting portion 89 and an inner circumferential surface of the insertion hole 105. This configuration enables movement of the circuit board 80, facilitating fine adjustment of the position of the nozzle plate 780.

Figure 14:
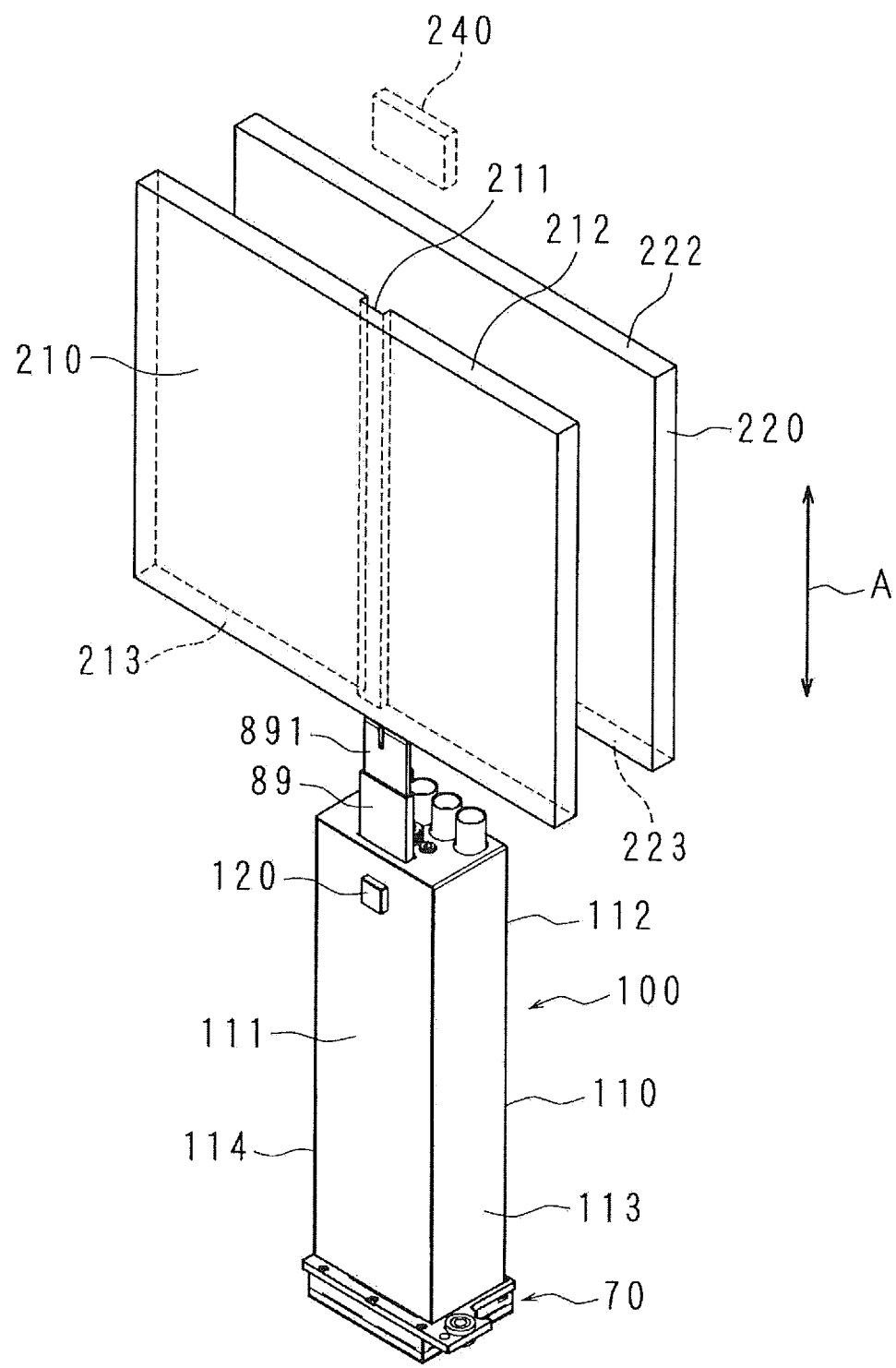
FIG. 14 is a schematic view of a configuration in which the head unit according to the present embodiment is installed in the ink-jet printer.

FIG. 14 illustrates a configuration in which the head unit 100 is installed on the ink-jet printer 200. While the plurality of the head units 100 are installed on the ink-jet printer 200 in reality, FIG. 14 illustrates only one head unit 100 for simplicity. The casing 110 of the head unit 100 has four side surfaces 111, 112, 113, 114. The side surface 111 and the side surface 112 are parallel with each other, and the side surface 113 and the side surface 114 are parallel with each other. A protrusion 120 is provided on the side surface 111 of the head unit 100.

The ink-jet printer 200 includes guide members 210, 220. When the head unit 100 is installed on the ink-jet printer 200 along the direction A, the guide member 210 guides the side surface 111, and the guide member 220 guides the side surface 112. The guide member 210 has an upper end 212 and a lower end 213. The guide member 220 has an upper end 222 and a lower end 223.

The guide members 210, 220 are opposed to each other at a particular distance therebetween such that the head unit 100 is insertable between the guide members 210, 220. The connector 240 of the ink-jet printer 200 is disposed above the guide members 210, 220. The terminal, not illustrated, of the connector 240 is connectable to the circuit-board terminal 891 of the circuit board 80.

The guide member 210 for guiding the side surface 111 has a groove 211 for guiding the protrusion 120. With this configuration, when the head unit 100 is installed onto the ink-jet printer 200, it is possible to prevent an occurrence of a situation in which the head unit 100 is installed in a wrong orientation (position) with the side surface 111 and the side surface 112 being reverse to each other, and the circuit-board terminal 891 inserted into the connector 240 in a wrong orientation, for example.

The protrusion 120 and the guide member 210 are arranged such that, when the head unit 100 is inserted along the direction A, the protrusion 120 and the guide member 210 (the lower end 213) come into contact with each other before the circuit board 80 (e.g., the circuit-board terminal 891) contacts the connector 240 of the ink-jet printer 200. In other words, when the head unit 100 is inserted in a proper orientation in the direction A, the guide member 210 guides the head unit 100 such that the circuit board 80 is connected to the connector 240. Also, when the head unit 100 is inserted in the direction A in an orientation different from the proper orientation (e.g., such a wrong orientation that the side surface 111 and the side surface 112 of the head unit 100 are reverse to each other), the lower end 213 of the guide member 210 contacts the head unit 100 before the circuit board 80 is connected to the connector 240, whereby the guide member 210 restricts movement of the head unit 100 in the direction A. Accordingly, it is possible to prevent insertion of the head unit 100 before the circuit-board terminal 891 is inserted into the connector 240 in a wrong orientation, thereby preventing damage to the circuit-board terminal 891 and the connector 240.

In the present embodiment, as described above, the head unit 100 does not increase in size in the longitudinal direction of the nozzle plate 780. Accordingly, in the case where the plurality of the head units 100 are arranged in the longitudinal direction of the nozzle plate 780, it is possible to arrange the head units 100 with high density.

What is claimed is:

1. A head unit to be installed in a liquid ejection apparatus, the head unit comprising:
    a head module comprising (i) a nozzle plate comprising an ejection surface defining an ejection opening, (ii) a liquid-passage defining member comprising a liquid passage communicating with the ejection opening, the liquid-passage defining member and the nozzle plate being stacked on each other in a stacking direction orthogonal to the ejection surface, (iii) a drive element configured to eject liquid from the ejection opening, and (iv) an interconnect member connected to the drive element;
    a circuit board connected to the interconnect member; and
    a casing connected to the head module and defining an accommodation space for accommodating the circuit board,
    a plurality of power supply circuits mounted on the circuit board,
    wherein the nozzle plate comprises:
        a first end and a second end spaced apart from each other in a first direction that is orthogonal to the stacking direction and that is along the ejection surface; and
        a third end and a fourth end spaced apart from each other in a second direction that is orthogonal to each of the stacking direction and the first direction and that is along the ejection surface,
    wherein a distance between the first end and the second end of the nozzle plate is greater than a distance between the third end and the fourth end of the nozzle plate,
    wherein the circuit board is disposed in the accommodation space such that a main surface of the circuit board extends along the stacking direction and the first direction,
    wherein the circuit board comprises:
        a fifth end and a sixth end spaced apart from each other in the first direction; and
        a seventh end and an eighth end spaced apart from each other in the stacking direction,
    wherein a distance between the seventh end and the eighth end of the circuit board is greater than a distance between the fifth end and the sixth end of the circuit board, and
    wherein the number of the power supply circuits arranged along the stacking direction is greater than the amber of the power supply circuits arranged alone the first direction.

2. The head unit according to claim 1, further comprising a plurality of integrated circuits mounted on the circuit board,
wherein the plurality of integrated circuits are arranged along the stacking direction.

3. The head unit according to claim 1, further comprising:
a holding plate secured to the head module and comprising a surface extending along the main surface of the circuit board; and
a screw secured to the holding plate,
wherein the circuit board comprises a through hole in which the screw is inserted, and
wherein a distance between the surface of the holding plate and a head of the screw is greater than a thickness of the circuit board in a direction orthogonal to the main surface.

4. The head unit according to claim 3, wherein a distance between the through hole and the fifth end is less than a distance between the through hole and the sixth end.

5. The head unit according to claim 3, wherein a distance between the through hole and the seventh end is less than a distance between the through hole and the eighth end.

6. The head unit according to claim 3,
wherein the circuit board further comprises a circuit-board terminal connectable to a connector of the liquid ejection apparatus, and
wherein the circuit-board terminal is nearer to the eighth end than to the seventh end.

7. The head unit according to claim 3, further comprising a liquid-passage tube disposed in the casing,
wherein the head module comprises a communication opening fluidically connected to the liquid-passage tube, and
wherein the holding plate is disposed between the liquid-passage tube and the circuit board.

8. The head unit according to claim 1, further comprising:
a holding plate secured to the head module and comprising a surface extending along the main surface of the circuit board;
a protrusion protruding in the second direction from the surface of the holding plate; and
a protruding portion protruding in the stacking direction from an end of the protrusion in the second direction,
wherein the circuit board comprises a through hole in which the protrusion is inserted, and
wherein a distance between the surface of the holding plate and the protruding portion is greater than a thickness of the circuit board in a direction orthogonal to the main surface.

9. The head unit according to claim 1,
wherein the casing comprises an insertion hole in which a portion of the circuit board is inserted, and
wherein a space is formed between an outer circumferential surface of the portion of the circuit board and an inner circumferential surface of the insertion hole.

10. The head unit according to claim 1, further comprising a protrusion provided on one side surface of the casing.

11. A liquid ejection apparatus installed with a plurality of head units, the plurality of head units each comprising:
a head module comprising (i) a nozzle plate comprising an ejection surface defining an ejection opening, (ii) a liquid-passage defining member comprising a liquid passage communicating with the ejection opening, the liquid-passage defining member and the nozzle plate being stacked on each other in a stacking direction orthogonal to the ejection surface, (iii) a drive element configured to eject liquid from the ejection opening, and (iv) an interconnect member connected to the drive element;
a circuit board connected to the interconnect member;
a casing connected to the head module and defining an accommodation space for accommodating the circuit board; and
a guide member configured to, when the plurality of head units are installed and removed, guide side surfaces of the plurality of head units along the stacking direction,
wherein the nozzle plate comprises:
a first end and a second end spaced apart from each other in a first direction that is orthogonal to the stacking direction and that is along the ejection surface; and
a third end and a fourth end spaced apart from each other in a second direction that is orthogonal to each of the stacking direction and the first direction and that is along the ejection surface,
wherein a distance between the first end and the second end of the nozzle plate is greater than a distance between the third end and the fourth end of the nozzle plate,
wherein the circuit board is disposed in the accommodation space such that a main surface of the circuit board extends along the stacking direction and the first direction,
wherein each of the plurality of head units comprises a protrusion provided on a corresponding one of the side surfaces, and
wherein the guide member comprises a plurality of grooves each configured to guide the protrusion of a corresponding one of the plurality of head units.

12. The liquid ejection apparatus according to claim 11, wherein the plurality of head units are arranged in the first direction.

13. The liquid ejection apparatus according to claim 11, wherein the guide member is configured to restrict movement of the plurality of head units in the stacking direction before the circuit board is connected to the connector when the plurality of head units are inserted in the stacking direction in an orientation different from a proper orientation.

14. A head unit to be installed in a liquid ejection apparatus, the head unit comprising:
a head module comprising (i) a nozzle plate comprising an ejection surface defining an ejection opening, (ii) a liquid-passage defining member comprising a liquid passage communicating with the ejection opening, the liquid-passage defining member and the nozzle plate being stacked on each other in a stacking direction orthogonal to the ejection surface, (iii) a drive element configured to eject liquid from the ejection opening, and (iv) an interconnect member connected to the drive element;
a circuit board connected to the interconnect member;
a casing connected to the head module and defining an accommodation space for accommodating the circuit board; and
a plurality of integrated circuits mounted on the circuit board,
wherein the nozzle plate comprises:
a first end and a second end spaced apart from each other in a first direction that is orthogonal to the stacking direction and that is along the ejection surface; and a third end and a fourth end spaced apart from each other in a second direction that is orthogonal to each of the stacking direction and the first direction and that is along the ejection surface, wherein a distance between the first end and the second end of the nozzle plate is greater than a distance between the third end and the fourth end of the nozzle plate, wherein the circuit board is disposed in the accommodation space such that a main surface of the circuit board extends along the stacking direction and the first direction, wherein the circuit board comprises:
a fifth end and a sixth end spaced apart from each other in the first direction; and
a seventh end and an eighth end spaced apart from each other in the stacking direction, wherein a distance between the seventh end and the eighth end of the circuit board is greater than a distance between the fifth end and the sixth end of the circuit board, and wherein the number of integrated circuits arranged along the stacking direction is greater than the number of integrated circuits arranged along the first direction.

15. A head unit to be installed in a liquid ejection apparatus, the head unit comprising:
a head module comprising (i) a nozzle plate comprising an ejection surface defining an ejection opening, (ii) a liquid-passage defining member comprising a liquid passage communicating with the ejection opening, the liquid-passage defining member and the nozzle plate being stacked on each other in a stacking direction orthogonal to the ejection surface, (iii) a drive element configured to eject liquid from the ejection opening, and (iv) an interconnect member connected to the drive element;
a circuit board connected to the interconnect member; and
a casing connected to the head module and defining an accommodation space for accommodating the circuit board,
wherein the nozzle plate comprises:
a first end and a second end spaced apart from each other in a first direction that is orthogonal to the stacking direction and that is along the ejection surface; and
a third end and a fourth end spaced apart from each other in a second direction that is orthogonal to each of the stacking direction and the first direction and that is along the ejection surface,
wherein a distance between the first end and the second end of the nozzle plate is greater than a distance between the third end and the fourth end of the nozzle plate,
wherein the circuit board is disposed in the accommodation space such that a main surface of the circuit board extends along the stacking direction and the first direction,
wherein the circuit board comprises:
a fifth end and a sixth end spaced apart from each other in the first direction; and
a seventh end and an eighth end spaced apart from each other in the stacking direction,
wherein a distance between the seventh end and the eighth end of the circuit board is greater than a distance between the fifth end and the sixth end of the circuit board,
wherein the head unit further comprises:
a holding plate secured to the head module and comprising a surface extending along the main surface of the circuit board;
a protrusion protruding in the second direction from the surface of the holding plate; and
a protruding portion protruding in the stacking direction from an end of the protrusion in the second direction,
wherein the circuit board comprises a through hole in which the protrusion is inserted, and
wherein a distance between the surface of the holding plate and the protruding portion is greater than a thickness of the circuit board in a direction orthogonal to the main surface.

16. A head unit to be installed in a liquid ejection apparatus, the head unit comprising:
a head module comprising (i) a nozzle plate comprising an ejection surface defining an ejection opening, (ii) a liquid-passage defining member comprising a liquid passage communicating with the ejection opening, the liquid-passage defining member and the nozzle plate being stacked on each other in a stacking direction orthogonal to the ejection surface, (iii) a drive element configured to eject liquid from the ejection opening, and (iv) an interconnect member connected to the drive element;
a circuit board connected to the interconnect member; and
a casing connected to the head module and defining an accommodation space for accommodating the circuit board,
wherein the nozzle plate comprises:
a first end and a second end spaced apart from each other in a first direction that is orthogonal to the stacking direction and that is along the ejection surface; and
a third end and a fourth end spaced apart from each other in a second direction that is orthogonal to each of the stacking direction and the first direction and that is along the ejection surface,
wherein a distance between the first end and the second end of the nozzle plate is greater than a distance between the third end and the fourth end of the nozzle plate,
wherein the circuit board is disposed in the accommodation space such that a main surface of the circuit board extends along the stacking direction and the first direction,
wherein the circuit board comprises:
a fifth end and a sixth end spaced apart from each other in the first direction; and
a seventh end and an eighth end spaced apart from each other in the stacking direction,
wherein a distance between the seventh end and the eighth end of the circuit board is greater than a distance between the fifth end and the sixth end of the circuit board,
wherein the head unit further comprises:
a holding plate secured to the head module and comprising a surface extending along the main surface of the circuit board; and
a screw secured to the holding plate,
wherein the circuit board comprises a through hole in which the screw is inserted,
wherein a distance between the surface of the holding plate and a head of the screw is greater than a thickness of the circuit board in a direction orthogonal to the main surface, and wherein a distance between the through hole and the fifth end is less than a distance between the through hole and the sixth end.

17. A head unit to be installed in a liquid ejection apparatus, the head unit comprising:
a head module comprising (i) a nozzle plate comprising an ejection surface defining an ejection opening, (ii) a liquid-passage defining member comprising a liquid passage communication with the ejection opening, the liquid-passage defining member and the nozzle plate being stacked on each other in a stacking direction orthogonal to the ejection surface, (iii) a drive element configured to eject liquid from the ejection opening, and (iv) an interconnect member connected to the drive element;
a circuit board connected to the interconnect member; and
a casing connected to the head module and defining an accommodation space for accommodating the circuit board,
wherein the nozzle plate comprises:
a first end and a second end spaced apart from each other in a first direction that is orthogonal to the stacking direction and that is along the ejection surface; and
a third end and a fourth end spaced apart from each other in a second direction that is orthogonal to each of the stacking direction and the first direction and that is along the ejection surface,
wherein a distance between the first end and the second end of the nozzle plate is greater than a distance between the third end and the fourth end of the nozzle plate,
wherein the circuit board is disposed in the accommodation space such that a main surface of the circuit board extends along the stacking direction and the first direction,
wherein the circuit board comprises:
a fifth end and a sixth end spaced apart from each other in the first direction; and
a seventh end and an eighth end spaced apart from each other in the stacking direction,
wherein a distance between the seventh end and the eighth end of the circuit board is greater than a distance between the fifth end and the sixth end of the circuit board,
wherein the head unit further comprises:
a holding plate secured to the head module and comprising a surface extending along the main surface of the circuit board; and
a screw secured to the holding plate,
wherein the circuit board comprises a through hole in which the screw is inserted,
wherein a distance between the surface of the holding plate and a head of the screw is greater than a thickness of the circuit board in a direction orthogonal to the main surface, and
wherein a distance between the through hole and the seventh end is less than a distance between the through hole and the eighth end.

18. A head unit to be installed in a liquid ejection apparatus, the head unit comprising:
a head module comprising (i) a nozzle plate comprising an ejection surface defining an ejection opening, (ii) a liquid-passage defining member comprising a liquid passage communicating with the ejection opening, the liquid-passage defining member and the nozzle plate being stacked on each other in a stacking direction orthogonal to the ejection surface, (iii) a drive element configured to eject liquid from the ejection opening, and (iv) an interconnect member connected to the drive element;
a circuit board connected to the interconnect member; and
a casing connected to the head module and defining an accommodation space for accommodating the circuit board,
wherein the nozzle plate comprises:
a first end and a second end spaced apart from each other in a first direction that is orthogonal to the stacking direction and that is along the ejection surface; and
a third end and a fourth end spaced apart from each other in a second direction that is orthogonal to each of the stacking direction and the first direction and that is along the ejection surface,
wherein a distance between the first end and the second end of the nozzle plate is greater than a distance between the third end and the fourth end of the nozzle plate,
wherein the circuit board is disposed in the accommodation space such that a main surface of the circuit board extends along the stacking direction and the first direction,
wherein the circuit board comprises:
a fifth end and a sixth end spaced apart from each other in the first direction; and
a seventh end and an eighth end spaced apart from each other in the stacking direction,
wherein a distance between the seventh end and the eighth end of the circuit board is greater than a distance between the fifth end and the sixth end of the circuit board,
wherein the head unit further comprises:
a holding plate secured to the head module and comprising a surface extending along the main surface of the circuit board; and
a screw secured to the holding plate,
wherein the circuit board comprises a through hole in which the screw is inserted,
wherein a distance between the surface of the holding plate and a head of the screw is greater than a thickness of the circuit board in a direction orthogonal to the main surface,
wherein the circuit board fılrther comprises a circuit-board terminal connectable to a connector of the liquid ejection apparatus, and
wherein the circuit-board terminal is nearer to the eighth end than to the seventh end.

19. A head unit to be installed in a liquid ejection apparatus, the head unit comprising:
a head module comprising (i) a nozzle plate comprising an ejection surface defining an ejection opening, (ii) a liquid-passage defining member comprising a liquid passage communicating with the ejection opening, the liquid-passage defining member and the nozzle plate being stacked on each other in a stacking direction orthogonal to the ejection surface, (iii) a drive element configured to eject liquid from the ejection opening, and (iv) an interconnect member connected to the drive element;
a circuit board connected to the interconnect member; and
a casing connected to the head module and defining an accommodation space for accommodating the circuit board,
wherein the nozzle plate comprises:

a first end and a second end spaced apart from each other in a first direction that is orthogonal to the stacking direction and that is along the ejection surface; and a third end and a fourth end spaced apart from each other in a second direction that is orthogonal to each of the stacking direction and the first direction and that is along the ejection surface, wherein a distance between the first end and the second end of the nozzle plate is greater than a distance between the third end and the fourth end of the nozzle plate, wherein the circuit board is disposed in the accommodation space such that a main surface of the circuit board extends along the stacking direction and the first direction, wherein the circuit board comprises:
  a fifth end and a sixth end spaced apart from each other in the first direction; and
  a seventh end and an eighth end spaced apart from each other in the stacking direction, wherein a distance between the seventh end and the eighth end of the circuit board is greater than a distance between the fifth end and the sixth end of the circuit board, wherein the head unit further comprises:
  a holding plate secured to the head module and comprising a surface extending along the main surface of the circuit board; and
  a screw secured to the holding plate, wherein the circuit board comprises a through hole in which the screw is inserted, wherein a distance between the surface of the holding plate and a head of the screw is greater than a thickness of the circuit board in a direction orthogonal to the main surface, wherein the head unit further comprises a liquid-passage tube disposed in the casing, wherein the head module comprises a communication opening fluidically connected to the liquid-passage tube, and wherein the holding plate is disposed between the liquid-passage tube and the circuit board.

* * * * *